United States Patent
Maeng et al.

(10) Patent No.: US 8,163,639 B2
(45) Date of Patent: Apr. 24, 2012

(54) PHOTO DIODE AND METHOD FOR MANUFACTURING THE SAME

(75) Inventors: Kye-wong Maeng, Seoul (KR); Sung-ryoul Bae, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 795 days.

(21) Appl. No.: 12/339,515

(22) Filed: Dec. 19, 2008

(65) Prior Publication Data

US 2009/0130793 A1 May 21, 2009

Related U.S. Application Data

(62) Division of application No. 11/095,482, filed on Apr. 1, 2005, now Pat. No. 7,482,665.

(30) Foreign Application Priority Data

May 25, 2004 (KR) ........................ 10-2004-0037330

(51) Int. Cl.
*H01L 21/225* (2006.01)

(52) U.S. Cl. ................. 438/563; 438/559; 257/E21.144

(58) Field of Classification Search .................. 438/369, 438/370, 542, 549, 551, 552, 558, 559, 563; 257/E21.144
See application file for complete search history.

(56) References Cited

U.S. PATENT DOCUMENTS

| | | | | | |
|---|---|---|---|---|---|
| 3,841,926 | A * | 10/1974 | Garnache et al. | ............. | 438/287 |
| 4,009,058 | A * | 2/1977 | Mills | ................ | 438/57 |
| 6,479,352 | B2 * | 11/2002 | Blanchard | ..................... | 438/268 |
| 7,122,408 | B2 * | 10/2006 | Mouli et al. | ................... | 438/134 |
| 7,135,349 | B2 * | 11/2006 | Maeng et al. | .................... | 438/48 |
| 7,573,113 | B2 * | 8/2009 | Mouli et al. | .................. | 257/440 |
| 2003/0109119 | A1 * | 6/2003 | Chakravarthi et al. | ........ | 438/563 |
| 2004/0082151 | A1 * | 4/2004 | Chakravarthi et al. | ........ | 438/563 |
| 2004/0251398 | A1 * | 12/2004 | Mouli et al. | ............... | 250/214.1 |
| 2005/0118743 | A1 * | 6/2005 | Maeng et al. | ................... | 438/57 |
| 2005/0167711 | A1 * | 8/2005 | Mouli et al. | .................. | 257/292 |

FOREIGN PATENT DOCUMENTS

| | | |
|---|---|---|
| JP | 11-312823 | 11/1999 |
| JP | 2003-264310 | 9/2003 |
| KR | 010061355 A | 7/2001 |
| KR | 1020030001150 A | 1/2003 |
| KR | 1020030049602 A | 6/2003 |

* cited by examiner

*Primary Examiner* — David Vu
*Assistant Examiner* — Earl Taylor
(74) *Attorney, Agent, or Firm* — Volentine & Whitt, PLLC (57) ABSTRACT

A method of fabricating a photo diode includes sequentially forming a buried layer of a first conductivity type, a first epitaxial layer of the first conductivity type, and a second epitaxial layer of a second conductivity type on a semiconductor substrate; forming a doped oxide film, including impurities of the second conductivity type, on the second epitaxial layer; forming a silicon nitride film on the oxide film; and patterning the oxide film and the silicon nitride film to sequentially form an oxide film pattern of the second conductivity type and a silicon nitride film pattern, respectively. The second conductivity type impurities are diffused from the oxide film pattern into the second epitaxial layer using a heat diffusion process to form a doped shallow junction layer of the second conductivity type, which converts the oxide film pattern into a non-conductive oxide film pattern.

13 Claims, 7 Drawing Sheets

PHOTO DIODE AND METHOD FOR MANUFACTURING THE SAME

This is a divisional of application Ser. No. 11/095,482, filed Apr. 1, 2005, which is incorporated herein by reference in its entirety.

BACKGROUND OF THE INVENTION

1. Field of the Invention

The present invention generally relates to a photo diode (PD) that converts incident light into an electrical signal. More particularly, the present invention generally relates to a photo diode having improved energy efficiency, and a method for manufacturing same.

A claim of priority is made to Korean Patent Application No. 2004-37330, filed on May 25, 2004, the disclosure of which is incorporated by reference herein.

2. Description of the Related Art

A photo diode is a common optical element used in a semiconductor device. The photo diode receives light and converts it into an electrical signal (current or voltage). Conventional methods for manufacturing the photo diode include: a method of utilizing a PN junction, a method for manufacturing a P-type electrode, including an intrinsic epitaxial layer—$N^+$-type layer—P-type substrate (PIP) type, and an N-type electrode, including an intrinsic epitaxial layer—$P^+$-type layer—P-type substrate (NIP) type, and a method of using an avalanche breakdown PD (APD).

However, a photo diode using a PN junction operates at low speed and has limited frequency characteristics. The APD generates large noise and requires high operating power. Thus, the NIP and PIN structure photo diodes have conventionally been preferred.

The NIP and PIN structure photo diodes are generally used in optical pickup devices such as CD-ROM, CD-R/RW, DVD-ROM, and DVD-R/RW. The photo diode is used to read data from a disc and/or write data to a disc. Additionally, the photo diode functions as an interface to transmit a signal to a servo.

Figure 1:
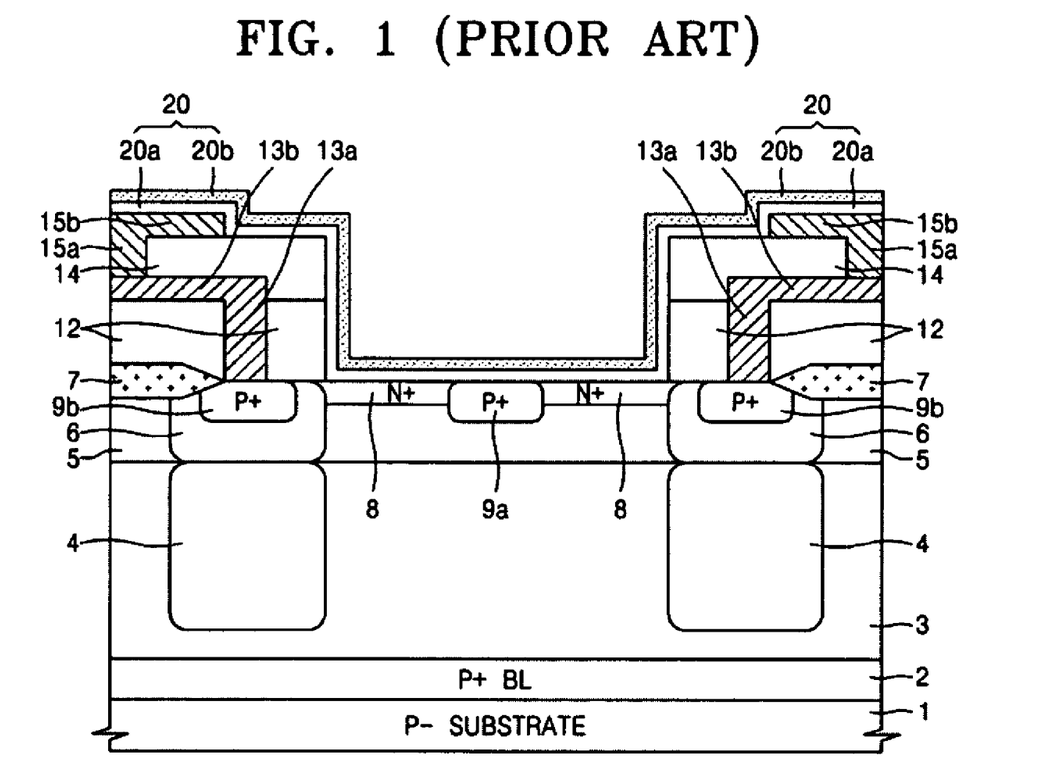
FIG. 1 is a sectional view illustrating a conventional NIP structured photo diode.

FIG. 1 is a sectional view illustrating a conventional NIP structured photo diode. In FIG. 1, a $P^+$-type buried layer 2, a P-type epitaxial layer 3, an N-type epitaxial layer 5, and an $N^+$-type highly doped layer 8 are sequentially formed on a substrate 1. A P-type first junction region 4 and a P-type second junction region 6 are formed and connected with each other in P-type epitaxial layer 3 and N-type epitaxial layer 5, respectively. Further, a $P^+$-type layer 9b is formed in P-type second junction region 6 and is in contact with an anode electrode metal contact plug 13a. A $P^+$-type partition layer 9a is formed on N-type epitaxial layer 5 to partition a light receiving portion of the photo diode, which functions as a window to receive light. Metal wire structures 13a, 13b, 15a, and 15b, and the anode electrode are insulated from their peripheries by an interlayer dielectric film 12 and an inter-metal dielectric film 14. Additionally, a device isolation layer 7, such as LOCOS, is used to isolate the photo diode from other peripheral devices are formed on substrate 1. Further, a silicon oxide film 20a and a silicon nitride film 20b are formed as an anti-reflective coating (ARC) layer 20 to suppress the reflection of incident light on the entire surface including the light receiving portion of the photo diode.

The photo diode is evaluated by light efficiency and frequency characteristics (or bandwidth). An excellent performing photo diode should have high photoelectric-conversion efficiency at a detected light wavelength, and should also have high response speed. Various studies and developments are under progress to improve the performance of the photo diode.

In particular, the reflection of incident light from the light receiving portion of the photo diode must be suppressed to increase the light efficiency at the detected wavelength. ARC layer 20 of FIG. 1 is formed on an upper surface of the light receiving portion to reduce this reflection. The type and thickness of ARC layer 20 is selected based on the wavelength and the intensity of light incident on the light receiving portion. However, controlling the thickness of ARC layer 20 is difficult.

Additionally, prior to the formation of ARC layer 20, interlayer dielectric film 12 and inter-metal dielectric film 14 are selectively etched and removed in order to expose the surface of semiconductor substrate 1. However, the surface of semiconductor substrate 1 may be over-etched during this process. Over-etching causes damage to the surface of semiconductor substrate 1, and the damage increases leakage current. Still, the over-etching is required because the thickness of interlayer dielectric film 12 and inter-metal dielectric film 14 are different.

A shallow junction for a terminal is an important factor in improving the light efficiency. However, it is difficult to form the shallow junction because $N^+$-type highly doped layer 8, P-type first junction region 4, P-type second junction region 6, $P^+$-type layer 9b, and $P^+$-type partition layer 9a are formed using implantation and heat-treatment processes which limit the improvement of the light efficiency.

SUMMARY OF THE INVENTION

The present invention provides a photo diode with improved light efficiency, and a method for manufacturing same.

According to an aspect of the present invention, there is provided a photo diode including a semiconductor substrate, a semiconductor substrate, a buried layer of first conductivity type, an epitaxial layer of first conductivity type, and an epitaxial layer of second conductivity type sequentially provided on the semiconductor substrate, a partition layer of first conductivity type provided on the epitaxial layer, a doped shallow junction layer of second conductivity type provided on adjacent sides of the partition layer, and a layered structure comprising a silicon oxide film pattern and a silicon nitride film pattern sequentially provided on the doped shallow junction layer.

According to another aspect of the present invention, there is provided a method of fabricating a photo diode by sequentially forming a buried layer of first conductivity type, an epitaxial layer of first conductivity type, and an epitaxial layer of second conductivity type on a semiconductor substrate, forming a doped oxide film second conductivity type on the epitaxial layer, forming a silicon nitride film on the oxide film, patterning the oxide film and the silicon nitride film to sequentially form an oxide film pattern of second conductivity type and a silicon nitride film pattern, respectively, and diffusing second conductivity type impurities from the oxide film pattern into the epitaxial layer using a heat diffusion process to form a doped shallow junction layer of second conductivity type, which converts the oxide film pattern into a non-conductive oxide film pattern.

According to still another aspect of the present invention, there is provided a method of fabricating a photo diode by sequentially forming a buried layer of first conductivity type, an epitaxial layer of first conductivity type, and an epitaxial layer of second conductivity type on a semiconductor substrate, forming a layered structure of anoxide film pattern and a silicon nitride film pattern on the epitaxial layer, forming a shallow junction layer second conductivity type in the epitaxial layer and beneath the layered structure by heat diffusing second conductive type impurities from the oxide film pattern to form the shallow junction layer, forming a partitioned layer first conductivity type between two adjacent shallow junction layers, forming an interlayer dielectric film and an inter-metal dielectric film on the layered structure and the epitaxial layer, etching the inter-metal dielectric film and the interlayer dielectric film by using the silicon nitride film pattern as an etching stopper film to form a light receiving portion, and forming an dielectric film on the light receiving portion to form a multi-layered anti-reflective coating comprising the dielectric film, the silicon nitride film pattern, and the oxide film pattern.

BRIEF DESCRIPTION OF THE DRAWINGS

The above aspects of the present invention will become more apparent upon consideration of several exemplary embodiments thereof with reference to the attached drawings in which.

DETAILED DESCRIPTION OF THE INVENTION

The present invention will now be described more fully with reference to the accompanying drawings, in which exemplary embodiments of the present invention are shown. The present invention may, however, be embodied in many different forms and should not be construed as being limited to the embodiments set forth herein; rather, these embodiments provide working examples. In the drawings, the thickness of layers and regions are exaggerated for clarity. To facilitate understanding, identical reference numerals have been used, where possible, to designate identical elements that are common to the figures. It will be understood that when an element such as layer, region or substrate is referred to as being "on" or "onto" another element, the element is either directly on the other element or intervening elements may also be present.

In one embodiment of the present invention, a method for manufacturing an NIP structure photo diode is disclosed. In the description of the present invention, a first conductive refers to a P-type and a second conductive refers to an N-type. An application device such as an optical pickup device can be readily manufactured by integrating an integrated circuit which processes electrical signals with the photo diode manufactured in accordance with the present invention.

FIGS. 2 through 11 are sectional views illustrating a method for manufacturing a photo diode according to the present invention.

Figure 2:
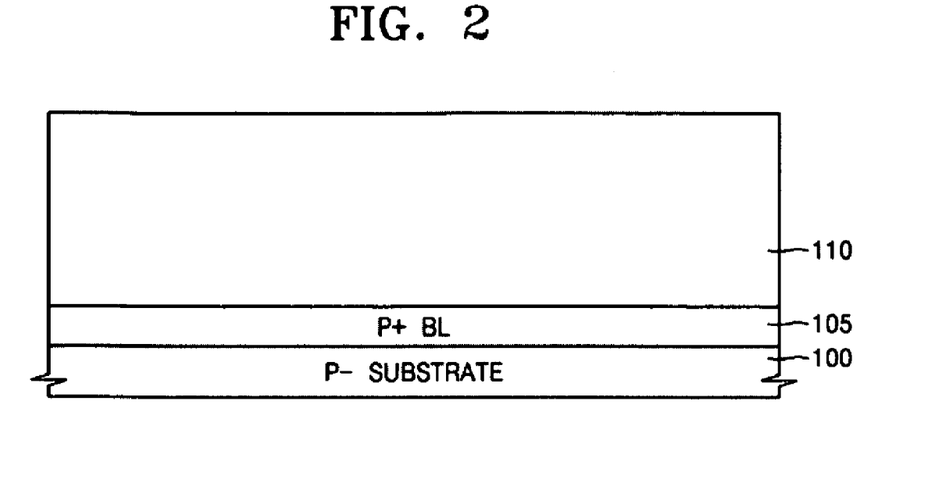
FIGS. 2 through 11 are sectional views illustrating a method for manufacturing a photo diode according to the present invention.

As shown in FIG. 2, a P-type semiconductor substrate 100 such as a single crystalline silicon substrate is provided to form a first conductive type. A $P^+$-type buried layer 105 is formed on the entire surface of P-type semiconductor substrate 100. Impurities such as boron (B) are implanted at high concentration of about 1E19 ions/cm$^3$, and then annealed to form $P^+$-type buried layer 105. A first conductive type, that is, a P-type epitaxial layer 110 is formed on $P^+$-type buried layer 105. The thickness and resistivity of P-type epitaxial layer 110 play an important role in the performance of a photo diode. In this regard, P-type epitaxial layer 110 is preferably grown to a thickness of about 8-12 μm with a resistivity of about 100-200 ohm-cm. Further, when P-type epitaxial layer 110 is grown on $P^+$-type buried layer 105, proper process conditions to minimize diffusion caused by $P^+$-type buried layer 105 are required.

Figure 3:
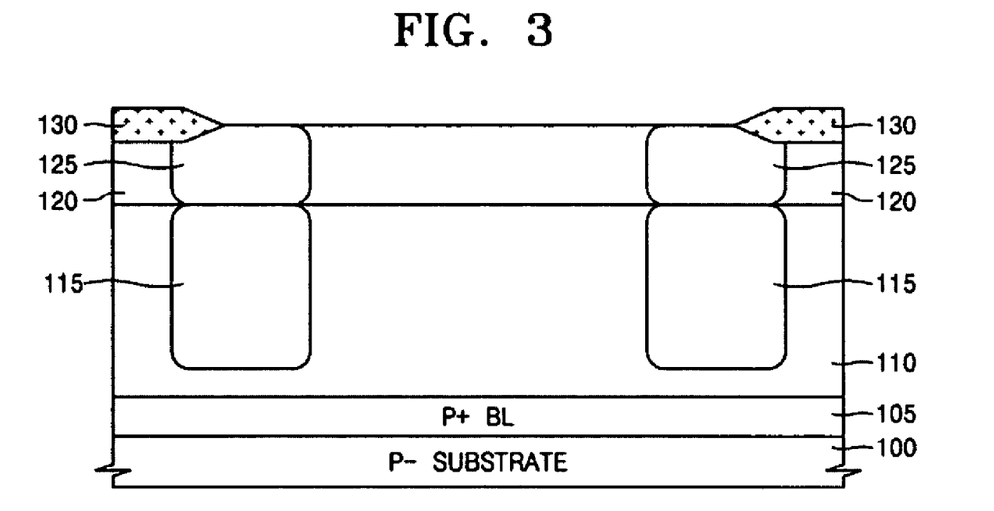

Next, as shown in FIG. 3, an implantation process is used to form a region of first conductivity type, that is, a P-type first junction region 115 in P-type epitaxial layer 110. A region of second conductivity type, that is, an N-type epitaxial layer 120 is formed on P-type epitaxial layer 110. Another region of first conductivity type, that is, a P-type second junction region 125 is formed by an implantation process in N-type epitaxial layer 120 aligned and in contact with P-type first junction region 115. A device isolation layer 130, such as Local Oxidation of Silicon (LOCOS) or Shallow Trench Isolation (STI), is then formed on substrate 100.

Figure 4:
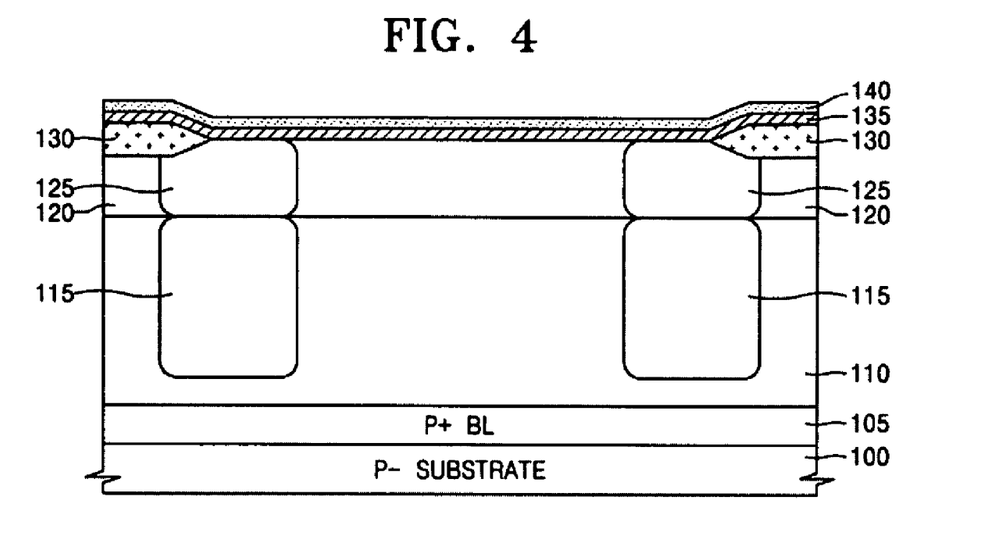

Referring to FIG. 4, in order to form a shallow junction region within the region of second conductivity type, that is, $N^+$-type layer (see reference numeral 8 of FIG. 1) is formed to reduce cathode resistance, a conductive oxide film 135 having high concentration of doped $N^+$-type impurities is formed, instead of using an implantation process. $N^+$-type conductive oxide film 135 is preferably a Phosphor-Silicate-Glass (PSG). $N^+$-type conductive oxide film 135 is deposited using a Chemical Vapor Deposition (CVD) process to a thickness of from about several hundreds to several thousands Angstroms. $N^+$-type conductive oxide film 135 preferably has a surface concentration of impurities ranging between 1E20-1E21 ions/cm$^3$.

A silicon nitride film 140 used a multi anti-reflective coating is deposited using a CVD process, preferably, a Plasma Enhanced CVD (PECVD) process to a thickness of about several hundreds to several thousands Angstroms on $N^+$-type conductive oxide film 135. During this process, $SiH_4$ and $NH_3$ are used as source gases, and Ar or He is used as a carrier gas. Silicon nitride film 140 is also used as an etching stopper layer in a subsequent process step wherein an interlayer dielectric film and an inter-metal dielectric film are etched. A conductive oxide film having doped $P^+$-type impurities, for example, Boro-Silicate-Glass (BSG) may be used to form the $P^+$-type shallow junction region.

Figure 5:
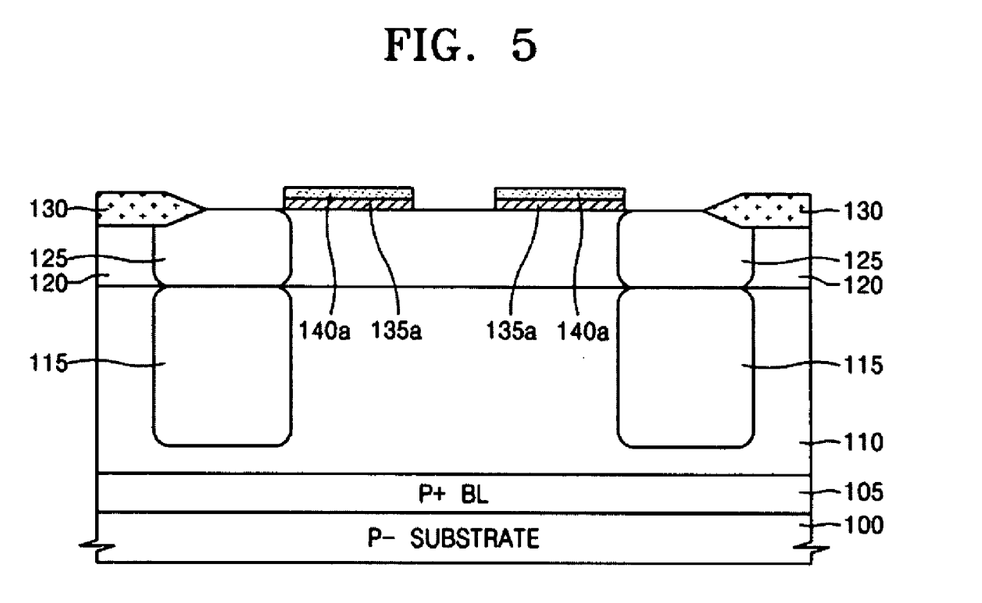

Referring to FIG. 5, conductive oxide film patterns 135a and silicon nitride film patterns 140a are formed on the above resultant structure. At this time, since conductive oxide film 135 such as PSG is formed at a high concentration, a pattern should be formed to insure a subsequent first conductive type, that is, $P^+$-type partition layer. When silicon nitride film 140 is etched, fluoro carbon-based gas is used, such as $C_xF_y$-based and $C_aH_bF_c$-based gas, specifically, $CF_4$, $CHF_3$, $C_2F_6$, $C_4F_8$, $CH_2F_2$, $CH_3F$, $CH_4$, $C_2H_2$, $C_4F_6$ or a mixture thereof.

Figure 6:
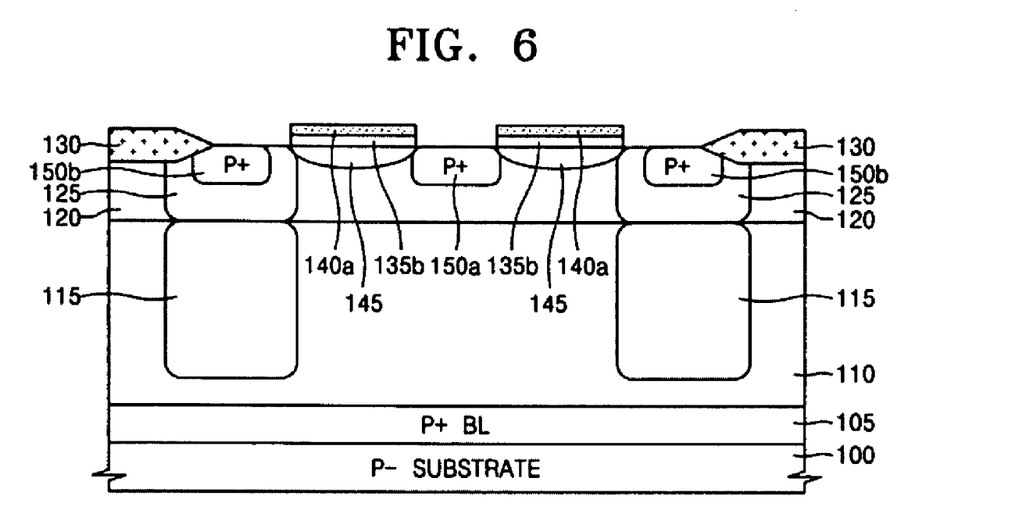

Next, as shown in FIG. 6, a heat diffusion process is used to diffuse N-type impurities from conductive oxide film patterns 135a to substrate 100 to form $N^+$-type shallow junction layers 145 in N-type epitaxial layer 120. In other words, impurities are transferred from conductive oxide film patterns 135a to form non-conductive oxide film patterns 135b. Accordingly, $N^+$-type shallow junction layers 145 are formed using solid state diffusion to have an impurity concentration of about 1E20-1E21 ions/cm$^3$. A layered structure of oxide film pattern 135b and silicon nitride film pattern 140a is formed on $N^+$-type shallow junction layer 145. The heat diffusion process is the preferred process technique to form a shallow junction. A junction depth is preferably about 0.5 μm. Since conductive oxide film 135 is relatively thin, and instead of using an ion implantation process, impurities are diffused into the substrate using heat treatment to form the junction region, N+-type shallow junction layer 145. According to the present invention, the shallow junction increases response speed, and light efficiency is increased due to the expansion of the depletion region.

Next, after an implantation mask (not shown) is formed on substrate 100 to later expose N-type epitaxial layer between the N+-type shallow junction layers 145, a region of first conductivity type, that is, a P+-type partition layer 150a is formed to partition the photo diode. Additionally, a region of first conductivity type, that is, P+-type layer 150b is formed using an implantation process in P-type second junction region 125. P+-type layer 150b functions to reduce the contact resistance of the anode electrode. Thereafter, the implantation mask is removed.

Figure 7:
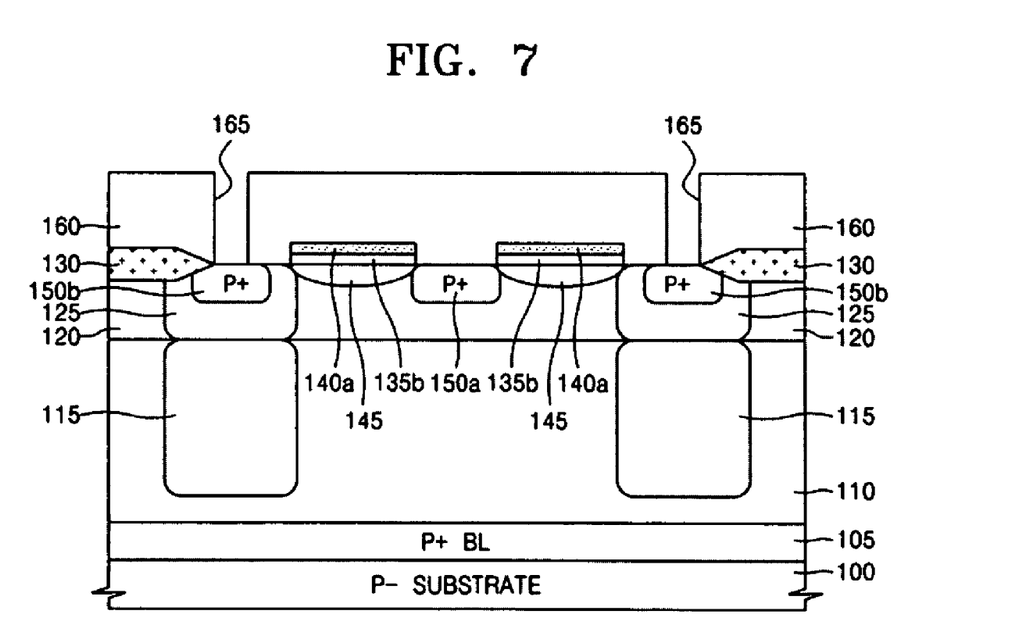

Next, as shown in FIG. 7, after an interlayer dielectric film 160 is deposited on the above resultant structure, a plurality of contact holes 165 are provided through a photolithography process to expose P+-type layer 150b. Interlayer dielectric film 160 is preferably formed to a thickness of about 12000 Å. The plurality of contact holes 165 are provided to form an anode electrode metal contact with P+-type layer 150b.

Figure 8:
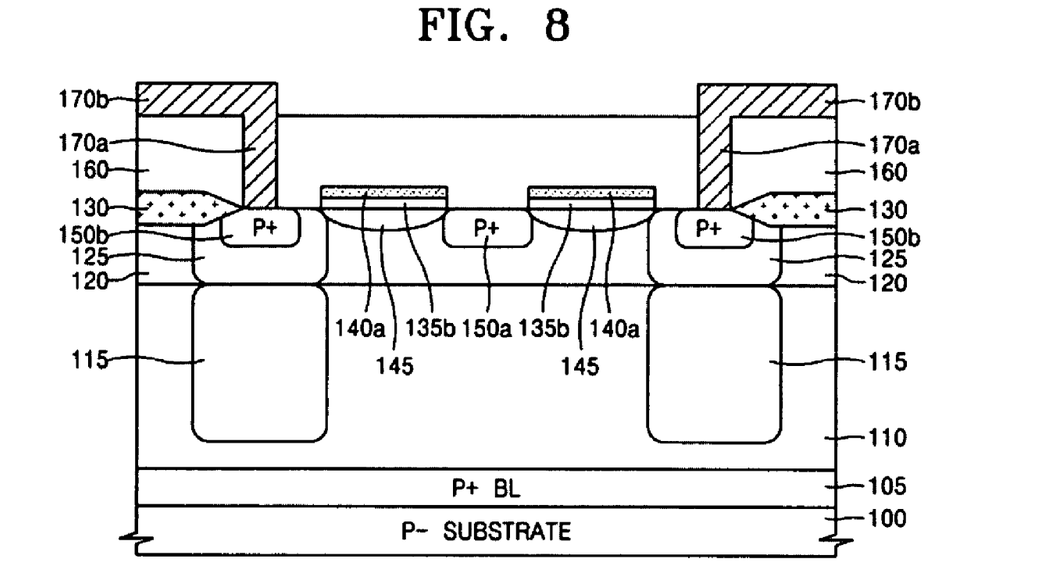

Next, as shown in FIG. 8, after metal is deposited to fill contact holes 165, a contact plug 170a and a first metal wire layer 170b are formed using a photolithography process. An inter-metal dielectric film 175 (see FIG. 9) is then formed on the resultant structure. Contact plug 170a and first metal wire layer 170b are in contact with P+-type layer 150b to form a first wire structure including the anode electrode. The cathode electrode (not shown) is formed to contact N+-type shallow junction layer 145 when contact plug 170a and first metal wire layer 170b are formed. Inter-metal dielectric film 175 preferably has a thickness of about 8000-10000 Å.

Figure 9:
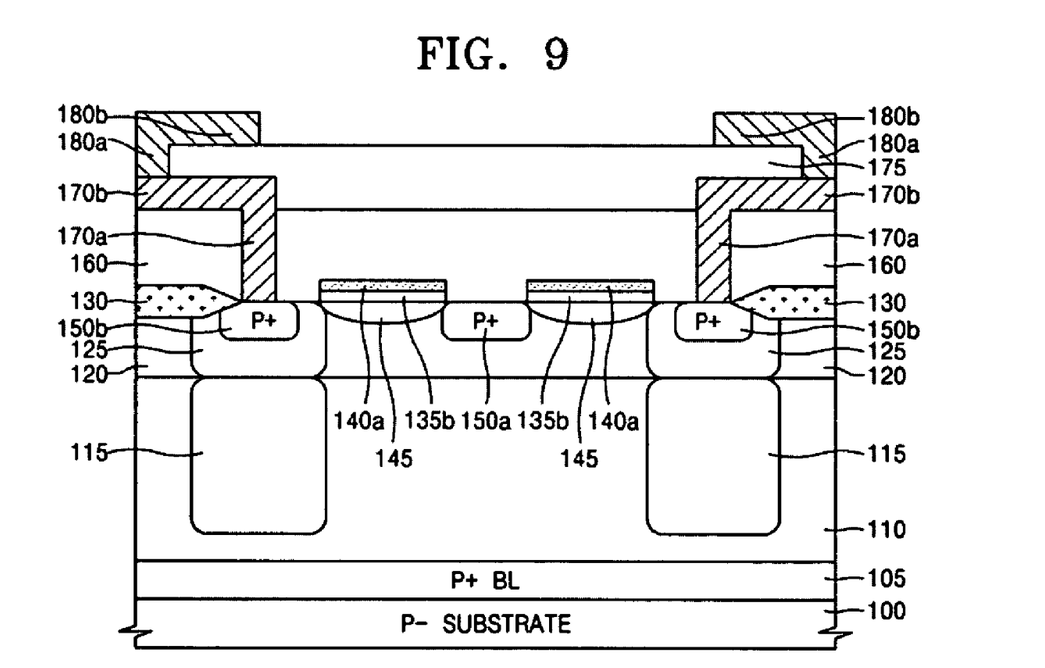

Next, as shown in FIG. 9, a via 180a and a second metal wire layer 180b are formed on inter-metal dielectric film 175 to complete a second wire structure contacting with the first wire structure.

Figure 10:
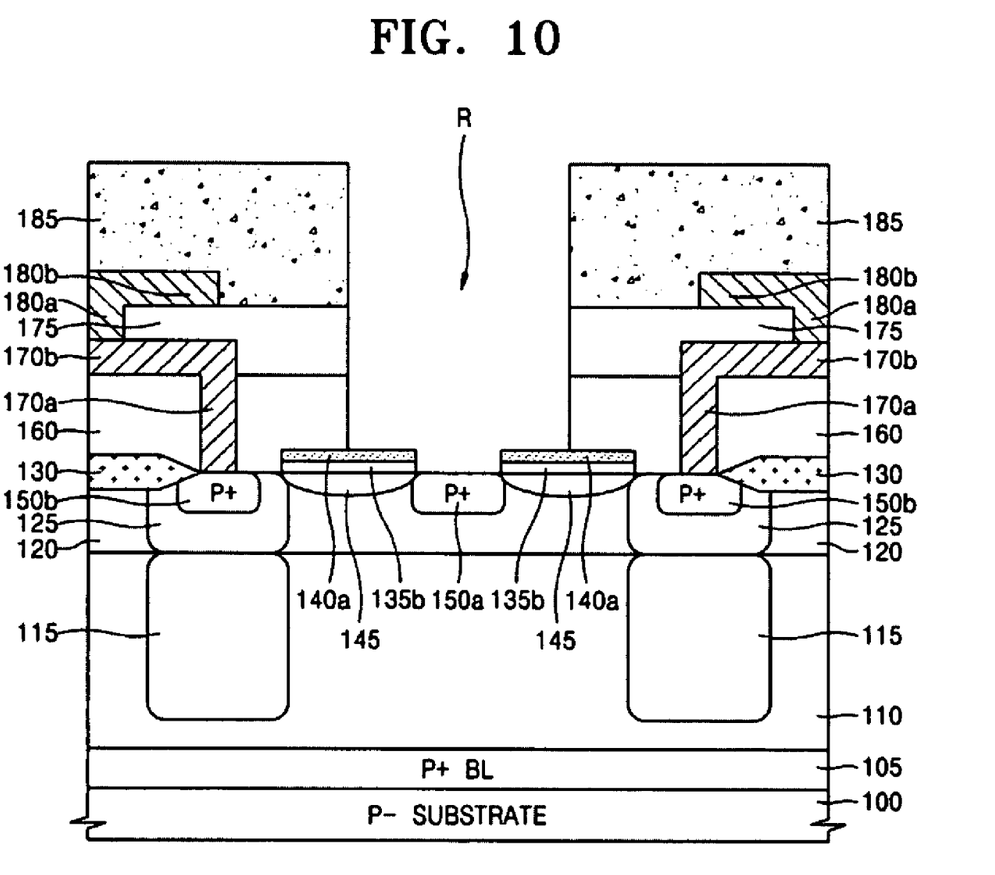

As shown in FIG. 10, a photoresist pattern (not shown) is formed to open a light receiving portion (R) in the resultant structure. The photoresist pattern 185b is used as an etching mask to etch interlayer dielectric film 160 and inter-metal dielectric film 175 to expose light receiving portion (R). Portions of interlayer dielectric film 160 and inter-metal dielectric film 175 are etched using a wet etching process, and then the remainder of interlayer dielectric film 160 is removed using a dry etching process. Inter-metal dielectric film 175 and interlayer dielectric film 160 are preferably wet-etched using Hydrogen Fluoride (HF) diluted with water or Buffered Oxide Etchant (BOE).

However, since the layered structure of oxide film pattern 135b and silicon nitride film pattern 140a is provided over semiconductor substrate 100, and silicon nitride film pattern 140a is used as the etching stopper film when interlayer dielectric film 160 and inter-metal dielectric film 175 are etched, P+-type partition layer 150a is exposed in light receiving portion (R). However, the etching damage on the semiconductor surface is reduced in comparison with the conventional method. Accordingly, leakage current is reduced.

Figure 11:
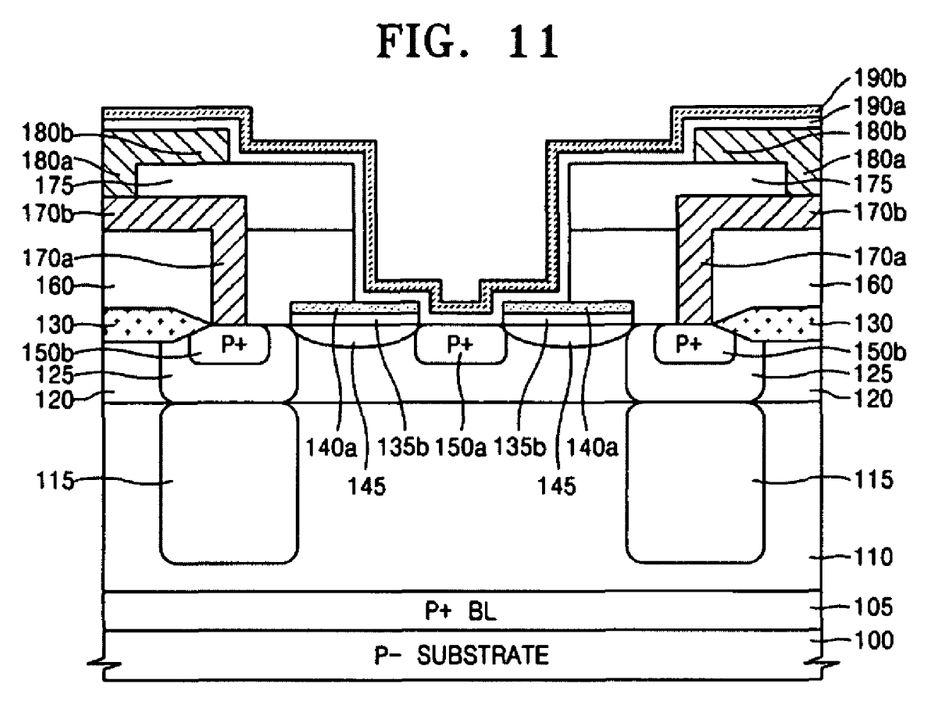

As shown in FIG. 11, after the photoresist pattern is removed, a silicon oxide film 190a and a silicon nitride film 190b are deposited on the entire surface of the resultant structure. Accordingly, in the present invention, oxide film pattern 135b, silicon nitride film pattern 140a, silicon oxide film 190a, and silicon nitride film 190b are used as the anti-reflective coating. This multi-layer anti-reflective coating improves light efficiency.

Silicon oxide film 190a is deposited using a PECVD process or similar process using gases of $SiH_4$ and $O_2$ (or $N_2O$). Silicon nitride film 190b is deposited by a PECVD process, wherein $SiH_4$ and $NH_3$ are preferably used as the source gases, and Ar or He is preferably used as the carrier gas.

While the present invention has been particularly shown and described with reference to exemplary embodiments thereof, it will be understood by those of ordinary skill in the art that various changes in form and detail may be made therein without departing from the scope of the present invention.

What is claimed is:

1. A method of fabricating a photo diode, comprising:
   sequentially forming a buried layer of a first conductivity type, an epitaxial layer of the first conductivity type, and an epitaxial layer of a second conductivity type on a semiconductor substrate;
   forming a doped oxide film, comprising impurities of the second conductivity type, on the epitaxial layer of the second conductivity type;
   forming a silicon nitride film on the oxide film;
   patterning the oxide film and the silicon nitride film to sequentially form an oxide film pattern of the second conductivity type and a silicon nitride film pattern, respectively; and
   diffusing the second conductivity type impurities from the oxide film pattern into the epitaxial layer of the second conductivity type using a heat diffusion process to form a doped shallow junction layer of the second conductivity type, which converts the oxide film pattern into a non-conductive oxide film pattern.

2. The method of claim 1, further comprising:
   forming an interlayer dielectric film and an inter-metal dielectric film on the silicon nitride film pattern;
   etching the inter-metal dielectric film and the interlayer dielectric film using the silicon nitride film pattern as an etching stopper film to form a light receiving portion; and
   forming a dielectric film on the light receiving portion to form a multi-layer anti-reflective coating comprising the dielectric film, the silicon nitride film pattern, and the oxide film pattern.

3. The method of claim 1, wherein the oxide film comprises a Phosphor-Silicate-Glass (PSG).

4. The method of claim 1, wherein the oxide film comprises a Boro-Silicate-Glass (BSG).

5. The method of claim 1, wherein the first conductivity type is P-type and the second conductivity type is N-type.

6. A method of fabricating a photo diode, comprising:
   sequentially forming a buried layer of a first conductivity type, a first epitaxial layer of the first conductivity type, and a second epitaxial layer of a second conductivity type on a semiconductor substrate;
   forming a layered structure of an oxide film pattern and a silicon nitride film pattern on the second epitaxial layer;
   forming a shallow junction layer of the second conductivity type in the second epitaxial layer and beneath the layered structure by heat diffusing impurities of second conductivity type from the oxide film pattern to form the shallow junction layer;
   forming a partitioned layer of the first conductivity type between two adjacent shallow junction layers;
   forming an interlayer dielectric film and an inter-metal dielectric film on the layered structure and the second epitaxial layer;
   etching the inter-metal dielectric film and the interlayer dielectric film using the silicon nitride film pattern as an etching stopper film to form a light receiving portion; and forming an dielectric film on the light receiving portion to form a multi-layered anti-reflective coating comprising the dielectric film, the silicon nitride film pattern, and the oxide film pattern.

7. The method of claim 6, further comprising:
forming a first junction region of the first conductivity type in the first epitaxial layer prior to forming the second epitaxial layer; and
forming a second junction of the first conductivity type in the second epitaxial layer aligned and in contact with the first junction region prior to forming the layered structure.

8. The method of claim 6, wherein the oxide film comprises a Phosphor-Silicate-Glass (PSG).

9. The method of claim 6, wherein the oxide film comprises a Boro-Silicate-Glass (BSG).

10. The method of claim 6, further comprising:
after the forming the second junction region, forming a device isolation film to isolate the photo diode.

11. The method of claim 6, wherein the etching of the inter-metal dielectric film and the interlayer dielectric film comprises:
removing a portion of the inter-metal dielectric film and the interlayer dielectric film using a wet etching process; and
removing remainder of the interlayer dielectric film using a dry etching process.

12. The method of claim 6, wherein the etching of the inter-metal dielectric film and the interlayer dielectric film comprises:
removing the inter-metal dielectric film and the interlayer dielectric film using a dry etching process.

13. The method of claim 6, wherein the first conductivity type is P-type and the second conductivity is N-type.

* * * * *